(12) United States Patent
Scanlan et al.

(10) Patent No.: US 7,898,066 B1
(45) Date of Patent: Mar. 1, 2011

(54) SEMICONDUCTOR DEVICE HAVING EMI SHIELDING AND METHOD THEREFOR

(75) Inventors: Christopher M. Scanlan, Chandler, AZ (US); Christopher J. Berry, Chandler, AZ (US); Timothy L. Olson, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 299 days.

(21) Appl. No.: 11/754,209

(22) Filed: May 25, 2007

(51) Int. Cl.
*H01L 23/552* (2006.01)
(52) U.S. Cl. ............... 257/659; 257/422; 257/660
(58) Field of Classification Search ........... 257/422, 257/659, 660
See application file for complete search history.

(56) References Cited

U.S. PATENT DOCUMENTS

| | | |
|---|---|---|
| 4,925,024 A | 5/1990 | Ellenberger et al. |
| 5,166,772 A | 11/1992 | Soldner et al. |
| 5,416,358 A | 5/1995 | Ochi et al. |
| 5,468,999 A | 11/1995 | Lin et al. |
| 5,473,191 A | 12/1995 | Tanaka |
| 5,557,142 A | 9/1996 | Gilmore et al. |
| 5,614,694 A | 3/1997 | Gorenz, Jr. et al. |
| 5,639,989 A | 6/1997 | Higgins, III |
| 5,656,864 A | 8/1997 | Mitsue et al. |
| 5,694,300 A | 12/1997 | Mattei et al. |
| 5,907,477 A | 5/1999 | Tuttle et al. |
| 5,940,271 A | 8/1999 | Mertol |
| 6,093,969 A * | 7/2000 | Lin ............................. 257/777 |
| 6,136,131 A | 10/2000 | Sosnowski |
| 6,194,655 B1 | 2/2001 | Lange, Sr. et al. |
| 6,246,115 B1 | 6/2001 | Tang et al. |
| 6,423,570 B1 | 7/2002 | Ma et al. |
| 6,433,420 B1 | 8/2002 | Yang et al. |
| 6,465,280 B1 | 10/2002 | Martin et al. |
| 6,602,737 B2 | 8/2003 | Wu |
| 6,686,649 B1 | 2/2004 | Mathews et al. |
| 7,030,469 B2 | 4/2006 | Mahadevan et al. |
| 2002/0089832 A1 | 7/2002 | Huang |
| 2003/0067757 A1 | 4/2003 | Richardson et al. |
| 2004/0217472 A1 * | 11/2004 | Aisenbrey et al. ............ 257/734 |
| 2005/0280139 A1 | 12/2005 | Zhao et al. |
| 2007/0030661 A1 | 2/2007 | Morris et al. |
| 2009/0184403 A1 * | 7/2009 | Wang et al. ................... 257/659 |

OTHER PUBLICATIONS

PCT/US2005/032678=WO 2006/036548 A2, Apr. 6, 2006.*

* cited by examiner

*Primary Examiner* — Thanh V Pham
(74) *Attorney, Agent, or Firm* — Weiss & Moy, P.C.

(57) ABSTRACT

A semiconductor device has a substrate having a plurality of metal layers. A die is coupled to the substrate. A plurality of metal wires is provided. At least one end of each of the metal wires is electrically coupled to at least one metal layer. A mold compound is used to encapsulate the die, a first surface of the substrate, and the plurality of metal wires. A portion of at least one metal wire remains exposed. A conductive coating is applied to the mold compound and to the portion of the at least one metal wire exposed.

11 Claims, 7 Drawing Sheets

SEMICONDUCTOR DEVICE HAVING EMI SHIELDING AND METHOD THEREFOR

FIELD OF THE INVENTION

This invention relates to semiconductor devices and, more specifically, to a semiconductor device having an integrated Electro-Magnetic Interference (EMI) shielding which is connected to exposed wires coupled to grounding pads.

BACKGROUND OF THE INVENTION

Electro-Magnetic Interference (EMI) shielding is required on certain semiconductor devices in order to minimize EMI radiation from the semiconductor device. EMI shielding is further required to prevent EMI radiation from external sources from interfering with operation of the semiconductor device.

EMI shielding is generally accomplished in one of three ways. A first method is to attach a metal can over the component after the component is attached to the motherboard. However, shield attach on the mother board has several problems. First, shield attach can be costly and a low yielding process. External shields soldered to the motherboard further require additional board space.

An alternative to the shield attached method described above is an embedded EMI shield. In an embedded shield, the metal EMI shield is directly attached to the semiconductor package substrate by means of solder or a conductive adhesive. The shield may be fully embedded within the mold compound of the finished package or can be exposed after assembly. In either case, the addition of a metal shield as a component attached to the top surface of the substrate is problematic for several reasons. First, the addition of a metal shield as a component attached to the top surface of the substrate requires a significant amount of additional space on the package substrate. Second, it can be difficult to transfer mold in and around the metal shield to fully encapsulate the semiconductor package. Shield attach is also problematic due to flux creep after the shield is attached and delamination and extrusion issues if solder is used to attach the shield. Metal shields also increase the thickness of the component and may inhibit the ability to inspect components under the shield during the assembly process.

The third method is the conventional conformal shield. In this method, all of the components are placed on the substrate and the substrate, or strip, is over-molded using unit molding, or pin gate molding where individual mold caps are defined within the strip such that upward facing, exposed pads in the substrate remain exposed after the mold operation. A conductive coating is then applied to the strip such that it covers the units and also makes electrical contact to the upward facing pads. The strip is then singulated into individual units. While this technique eliminates the molding process concerns associated with the aforementioned embedded shield method, it does not eliminate the added substrate size required to form the so-called upward facing, exposed pads. Therefore, all of the existing solutions can be said to require these large contact pads on the top, or upward facing surface of the substrate.

Therefore, a need existed to provide a device and method to overcome the above problems.

SUMMARY OF THE INVENTION

A semiconductor device and method of manufacturing has a substrate having a plurality of metal layers. A die is coupled to the substrate. A plurality of metal wires is provided wherein at least one end of each of the metal wires is electrically coupled to at least one metal layer of the substrate. A mold compound is used to encapsulate the die, a first surface of the substrate, and the plurality of metal wires. A portion of at least one of the metal wires will remain exposed. A conductive coating is applied to the mold compound and to the portion of the at least one metal wire exposed.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
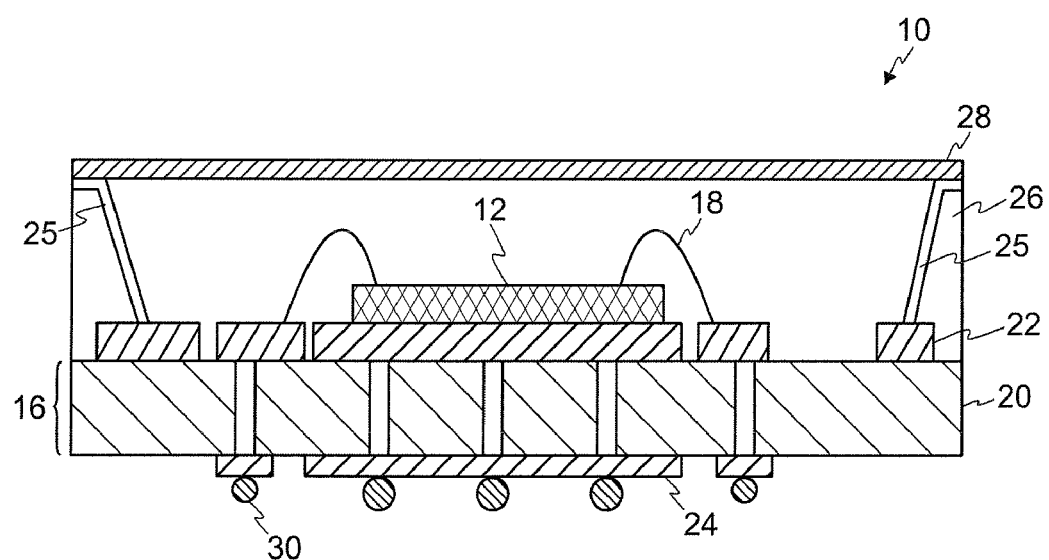
FIG. 1 is a cross-sectional view of one embodiment of the semiconductor device of the present invention.

Referring to FIG. 1, a semiconductor device 10 is shown. The semiconductor device 10 may be a lead type of device, a BGA type of device, a Land Grid Array (LGA) type of device, or the like. The listing of the above should not be seen as to limit the scope of the present invention.

The semiconductor device 10 has a die 12. The die 12 may be any type of device. For example, the die 12 may be a memory device, a logic device, an ASIC device, and other like elements. It should be noted that the listing of the above types of die 12 is given as an example and should not be seen as to limit the scope of the present invention. The die 12 is coupled to a first surface of a substrate 16. An adhesive is generally used to couple the die 12 to the substrate 16. The adhesive may be an adhesive film, an epoxy, or the like. The listing of the above adhesive types should not be seen as to limit the scope of the present invention. The die 12 is electrically coupled to the substrate 16. The die 12 may be coupled to the substrate 16 through the use of wirebonds 18. Alternatively, a flip chip may be used. It should be noted that instead of a die 12, a stacked die or multiple side-by-side die may be used as well as a surface mounted device (SMD).

The die 12 is placed on the first surface of the substrate 16. The substrate 16 may be any one chosen from a conventional rigid PCB, a flexible PCB, leadframe, ceramic and an equivalent thereof, but the kind of substrate 16 is not limited herein. The substrate 16 includes an insulation layer 20 having predetermined area and thickness. The insulation layer 20 has an approximately planar first surface and an approximately planar second surface opposing the first surface. The substrate 16 has a plurality of metal traces 22 formed on the first surface of the insulation layer 20 and a plurality of metal traces 24 formed on the second surface thereof. While FIG. 1 shows only one layer of metal traces 22 formed on the first surface of the insulation layer 20 and one layer of metal traces 24 formed on the second surface thereof, multiple layers of metal traces 22 and 24 may be formed on either or both surfaces of the insulation layer 20. The number of metal layers is not limited to the number shown in the Figures. If multiple layers of metal traces 22 and 24 are formed, a dielectric layer is generally applied between the metal layers. The dielectric layer is used an insulating layer to separate two signal layers. A soldermask is generally placed over the top surface of the metal traces 22 and 24 formed on the substrate 16. The soldermask is used to protect the metal traces 22 and 24.

A plurality of metal wires 25 are electrically coupled to the metal traces 22 formed on the first surface of the insulation layer 20. In general, the metal wires 25 are wirebonded to the metal traces 22. In accordance with one embodiment, both ends of the metal wires 25 are electrically coupled to the metal traces 22 so that the metal wires 25 form a loop. The metal wires may be gold, copper, aluminum, or the like. The listing of the above is given as examples and should not be seen as to limit the scope of the present invention.

A mold compound 26 is used to encapsulate the semiconductor device 10. The mold compound 26 is mainly made of non-conductive material, which is applied on the top surface of the die 12 and substrate 16 and the exposed soldermask placed over the top surface of the last layer of metal traces 22. During the process of applying the mold compound 26, the loops formed by the metal wires 25 are compressed by the mold tooling so that the top of the loop of the metal wires 25 are exposed on the top of the package after molding. A cleaning process may be performed to remove any mold compound 26 that may have formed on the top of the loop of the metal wires 25. The cleaning process will clean the contact area of the metal wire 25, resulting in increased contact area and reduced contact resistance between the metal wire 25 and a conductive coating 28 to be applied. The cleaning process may be done by chemical removal process, a grinding process or other physical abrasion techniques, laser ablation, and the like. The listing of the above is given as examples and should not be seen as to apply to a specific embodiment or to limit the scope of the present invention.

A conductive coating 28 is then applied to the semiconductor device 10. The conductive coating 28 is used to provide EMI shielding for the semiconductor device 10. The conductive coating 28 may be applied by plating, vacuum printing, vacuum deposition, insert molding, spray coating, and the like. The conductive coating 28 is applied to the top surface of the semiconductor device 10. The conductive coating 28 is applied so that the conductive coating 28 is in contact with the exposed portion of the top of the loop of the metal wires 25. Thus, the semiconductor device 10 will have a conductive coating 28 that contacts grounded metal. In FIG. 1, the conductive coating 28 is a conformal coating. In a conformal coating, a thin layer of the conductive coating 28 is applied to the top surface of the semiconductor device 10.

Electrical contacts 30 are coupled to a second surface of the substrate 16. The electrical contacts 30 may be a plurality of solder balls 30 as shown in FIG. 1, a plurality of leads, or the like. If solder balls 30 are used, the solder balls 30 will be electrically coupled to the second surface of the substrate 16. In general, a reflow process may be used to couple the solder balls 30 to the second surface of the substrate 16. Alternative methods may be used to couple the leads to the substrate 16 without departing from the spirit and scope of the present invention.

Figure 2:
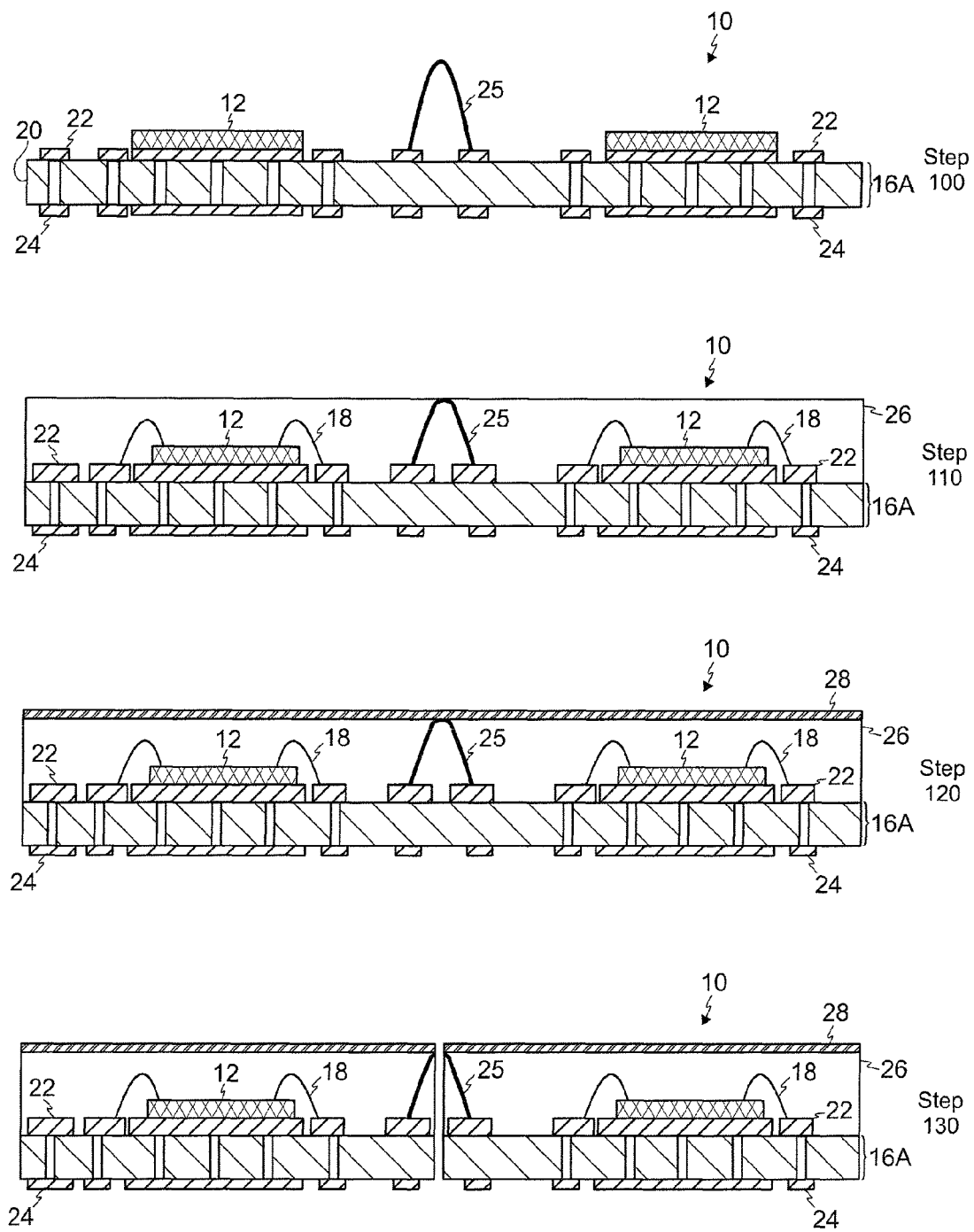
FIG. 2 is a process flow diagram depicting one method of forming the semiconductor device of FIG. 1.

Referring to FIG. 2, a method of forming the semiconductor device 10 will be described. The semiconductor device 10 is assembled in strip fashion as shown in Step 100. In a strip assembly, a plurality of semiconductor devices 10 is formed from a single substrate strip 16A. The substrate strip 16A is segmented into a plurality of rows and columns to form individual semiconductor devices 10. While FIG. 2 only shows a two dimensional view and a substrate strip 16A having only two rows, the substrate strip 16A may have a plurality of rows and columns to form individual semiconductor devices 10. The substrate strip 16A will be a fully manufactured substrate strip 16A. Each segmented section of the substrate strip 16A will include an insulation layer 20 having predetermined area and thickness. A plurality of metal traces 22 are formed on the first surface of the insulation layer 20 and a plurality of metal layers 24 formed on the second surface thereof. A soldermask may then be placed over the top surface of the last metal traces 22 and 24 formed on the substrate 16.

A die 12 is coupled to a first surface of a substrate 16 for each module on the substrate strip 16A. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip or other methods may be used.

Once each die 12 is coupled to a first surface of a substrate 16 for each module on the substrate strip 16A, the metal wires 25 are electrically coupled to the metal traces 22 formed on the first surface of the insulation layer 20. The metal wires 25 are wirebonded to the metal traces 22. In accordance with one embodiment, both ends of the metal wires 25 are electrically coupled to the metal traces 22 so that the metal wires 25 form a loop. As shown in FIG. 2, the metal wires 25 are looped to span across adjacent semiconductor devices 10.

After the metal wires 25 have been attached to the metal traces 22, a mold compound 26 is used to encapsulate the semiconductor device 10 as shown in Step 110. During the process of applying the mold compound 26, the loops formed by the metal wires 25 are compressed by the mold tool so that a section of the loop of the metal wires 25 are exposed on the top of the package after molding. To ensure that mold compound 26 does not coat portions of the loop of the metal wires 25, a compliant coating may be applied on the mold tool cavity. The coating would form a seal on the top of the loop of the metal wires 25 to ensure that the mold compound 26 would not cover the top portion of the loop of the metal wires 25. This type of encapsulation process is typically referred to as film assisted molding. Other methods to seal the top of the loop of the metal wires 25 to ensure that the mold compound 26 does not cover the top portion of the loop of the metal wires 25 may be used without departing from the spirit and scope of the present invention.

A conductive coating 28 is then applied to the semiconductor device 10 as shown in step 120. The conductive coating 28 may be applied by plating, vacuum printing, vacuum deposition, insert molding, spray coating, and the like. The conductive coating 28 may be Cu—Ni—Sn, Cu—Sn, Ni—Sn, Ag, electrically conductive polymer or the like. The listing is given as an example and should not be seen as to limit the scope of the present invention.

In Step 120, the conductive coating 28 is a conformal coating. In a conformal coating, a thin layer of the conductive coating 28 is applied to the top surface of the semiconductor device 10. The conductive coating 28 is applied so that the conductive coating 28 is in contact with the exposed portion of the loop of the metal wires 25. Thus, the semiconductor device 10 will have a conductive coating 28 that contacts grounded metal.

As shown in Step 130, the substrate strip 16A is then singulated. The substrate strip 16A is singulated using a standard package singulation process such as saw, laser cutting or water jet cutting. However, it should be noted that other methods may be used to singulate the substrate strip 16A without departing from the spirit and scope of the present invention. Since the metal wires 25 are bonded between adjacent semiconductor devices 10, the package singulation process would cut the metal wires 25 so that a cross section of the metal wire 25 is exposed on the edges of the semiconductor device 10. After singulation, a semiconductor device 10 is formed that will have a conductive coating 28 that contacts grounded metal on one or more sides.

Electrical contacts (not shown) may be coupled to a second surface of the substrate 16. The electrical contacts may be a plurality of solder balls, a plurality of leads, or the like. The electrical contacts may be coupled before or after singulation.

Figure 3:
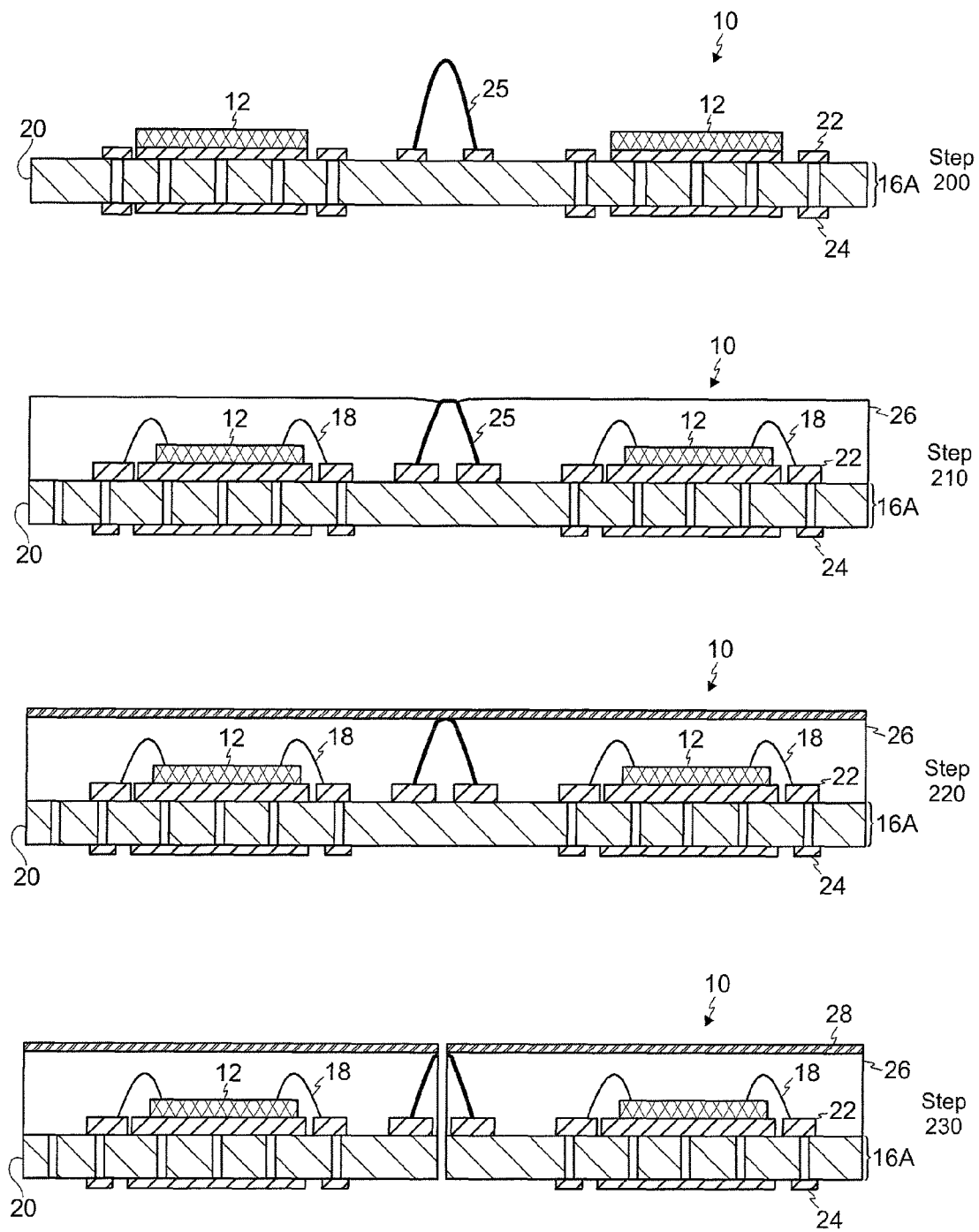
FIG. 3 is a process flow diagram depicting a second method of forming the semiconductor device of FIG. 1.

Referring to FIG. 3, another method of forming the semiconductor device 10 will be described. The semiconductor device 10 is assembled in strip fashion as shown in Step 200. A plurality of semiconductor devices 10 are formed from a single substrate strip 16A. The substrate strip 16A will be a fully manufactured substrate strip 16A. Each segmented section of the substrate strip 16A will include an insulation layer 20 having predetermined area and thickness. A plurality of metal traces 22 are formed on the first surface of the insulation layer 20 and a plurality of metal layers 24 formed on the second surface thereof. A soldermask may then be placed over the top surface of the last metal traces 22 and 24 formed on the substrate 16.

A die 12 is coupled to a first surface of a substrate 16 for each module on the substrate strip 16A. Some type of adhesive is generally used to couple the die 12 to the substrate 16. The die 12 is then electrically coupled to the substrate 16. The die 12 may be coupled to the substrate 16 through the use of wirebonds 18. Alternatively, a flip chip or other methods may be used.

Once each die 12 is coupled to a first surface of a substrate 16 for each module on the substrate strip 16A, the metal wires 25 are electrically coupled to the metal traces 22 formed on the first surface of the insulation layer 20. The metal wires 25 are wirebonded to the metal traces 22. In accordance with one embodiment, both ends of the metal wires 25 are electrically coupled to the metal traces 22 so that the metal wires 25 form a loop. As shown in FIG. 3, the metal wires 25 are looped to span across adjacent semiconductor devices 10. Additional metal wires 25A may be looped and electrically coupled to metal traces 22 internal to the semiconductor device 10 as shown in the bottom right semiconductor device 10 of FIG. 4. The metal wires 25A would provide internal isolation for the die 12.

After the metal wires 25 and 25A have been attached to the metal traces 22, a mold compound 26 is used to encapsulate the semiconductor device 10 as shown in Step 210. During the process of applying the mold compound 26, the loops formed by the metal wires 25 and 25A are compressed by the mold cavity so that a portion of the loop of the metal wires 25 and 25A are exposed on the top of the package after molding.

After the mold compound 26 is applied, a cleaning process is performed as shown in Step 220. The cleaning step is done to remove any mold compound 26 that may have formed on the top of the loop of the metal wires 25. The cleaning step will clean the contact area of the metal wire 25, resulting in increased contact area and reduced contact resistance between the wire and the conductive coating. The cleaning step may be done by chemical removal process, a grinding process or other physical abrasion techniques, laser ablation, and the like. The listing of the above is given as examples and should not be seen as to limit the scope of the present invention. FIG. 3 shows the results of a process which ablates only the mold compound 26. The top portion of the metal wire 25 is not removed. An alternative cleaning process may be used which would not only remove the mold compound 26 but also the top portion of metal wire 25.

A conductive coating 28 is then applied to the semiconductor device 10 as described in Step 230. The conductive coating 28 may be applied by plating, vacuum printing, vacuum deposition, insert molding, spray coating, and the like. The conductive coating 28 may be Cu—Ni—Sn, Cu—Sn, Ni—Sn or the like. The listing is given as an example and should not be seen as to limit the scope of the present invention. A cleaning step may not be required if a compliant layer such as the aforementioned film assisted molding is used within the mold tool to prevent mold compound from coating the top of the exposed wires.

In Step 230, the conductive coating 28 is a conformal coating. In a conformal coating, a thin layer of the conductive coating 28 is applied to the top surface of the semiconductor device 10. The conductive coating 28 is applied so that the conductive coating 28 is in contact with the exposed portion of the top of the loop of the metal wires 25. Thus, the semiconductor device 10 will have a conductive coating 28 that contacts grounded metal.

Once the conductive coating 28 is applied, the substrate strip 16A is then singulated. The substrate strip 16A is singulated using a standard package singulation process such as saw, laser cutting or water jet cutting. However, it should be noted that other methods may be used to singulate the substrate strip 16A without departing from the spirit and scope of the present invention. Since the metal wires 25 are bonded between adjacent semiconductor devices 10, the package singulation process would cut the metal wires 25 so that a cross section of the metal wire 25 is exposed on the edges of the semiconductor device 10. After singulation, a semiconductor device 10 is formed that will have a conductive coating 28 that contacts grounded metal on one or more sides.

Electrical contacts (not shown) may be coupled to a second surface of the substrate 16. The electrical contacts may be a plurality of solder balls, a plurality of leads, or the like. The electrical contacts may be coupled before or after singulation.

Figure 4:
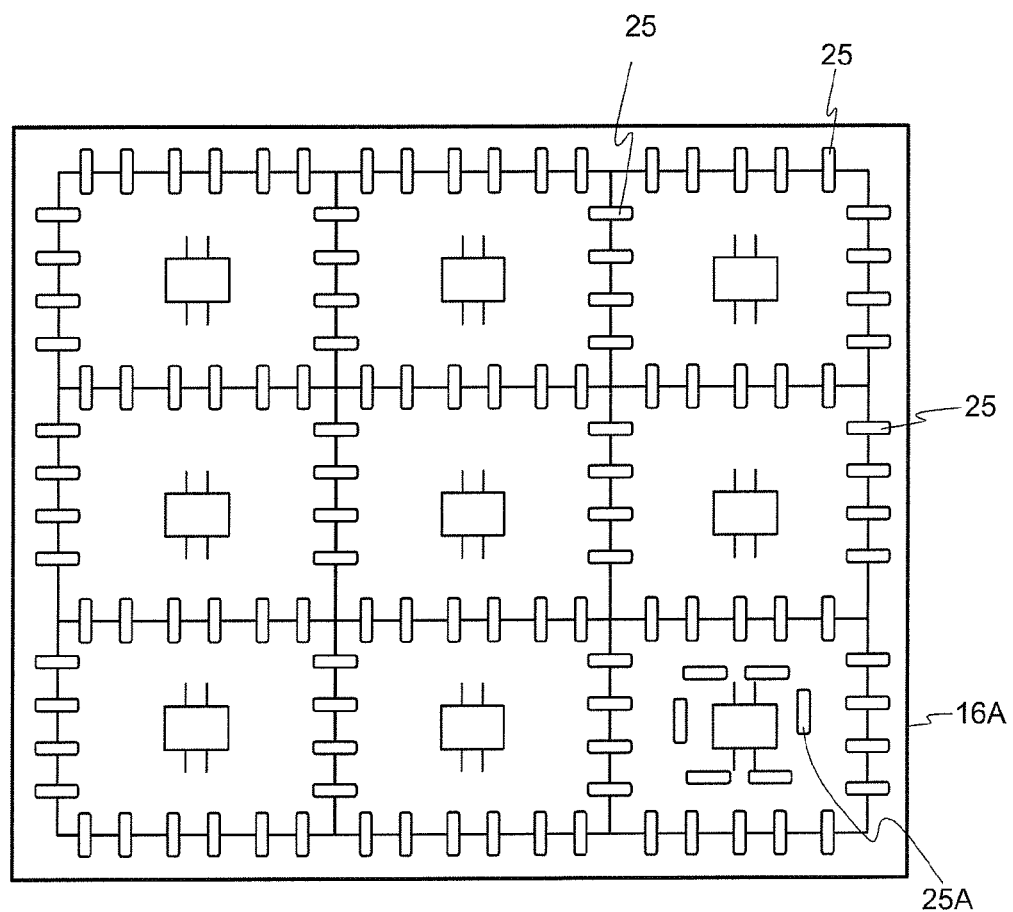
FIG. 4 is a top view of one embodiment of the layout of the metal wires on the substrate strip.

Referring to FIG. 4, a top view of one embodiment of the layout of the metal wires 25 on the substrate strip 16A is shown. In this embodiment, similar to that shown in FIGS. 1-3, the metal wires 25 are looped to span across adjacent semiconductor devices 10. Thus, the metal wires 25 are electrically coupled to metal traces 22 on adjacent semiconductor devices 10 on the substrate strip 16A. Additional metal wires 25A may be looped and electrically coupled to metal traces 22 internal to the semiconductor device 10 as shown in the bottom right semiconductor device 10 of FIG. 4. The metal wires 25A would provide internal isolation for the semiconductor device 10 between different sections of the semiconductor device 10. A cleaning process may be performed to remove any mold compound 26 that may have formed on the top of the loop of the metal wires 25. The cleaning step will clean the contact area of the metal wires 25 and 25A, resulting in increased contact area and reduced contact resistance between the wire and the conductive coating. The cleaning step may be done by chemical removal process, a grinding process or other physical abrasion techniques, laser ablation, and the like. The listing of the above is given as examples and should not be seen as to limit the scope of the present invention. A conductive coating 28 is then applied to provide EMI shielding for the semiconductor device 10. The conductive coating 28 is applied so that the conductive coating is in contact with the exposed portion of the top of the loop of the metal wires 25 and 25A. Thus, the semiconductor device 10 will have a conductive coating 28 that contacts grounded metal.

Figure 5:
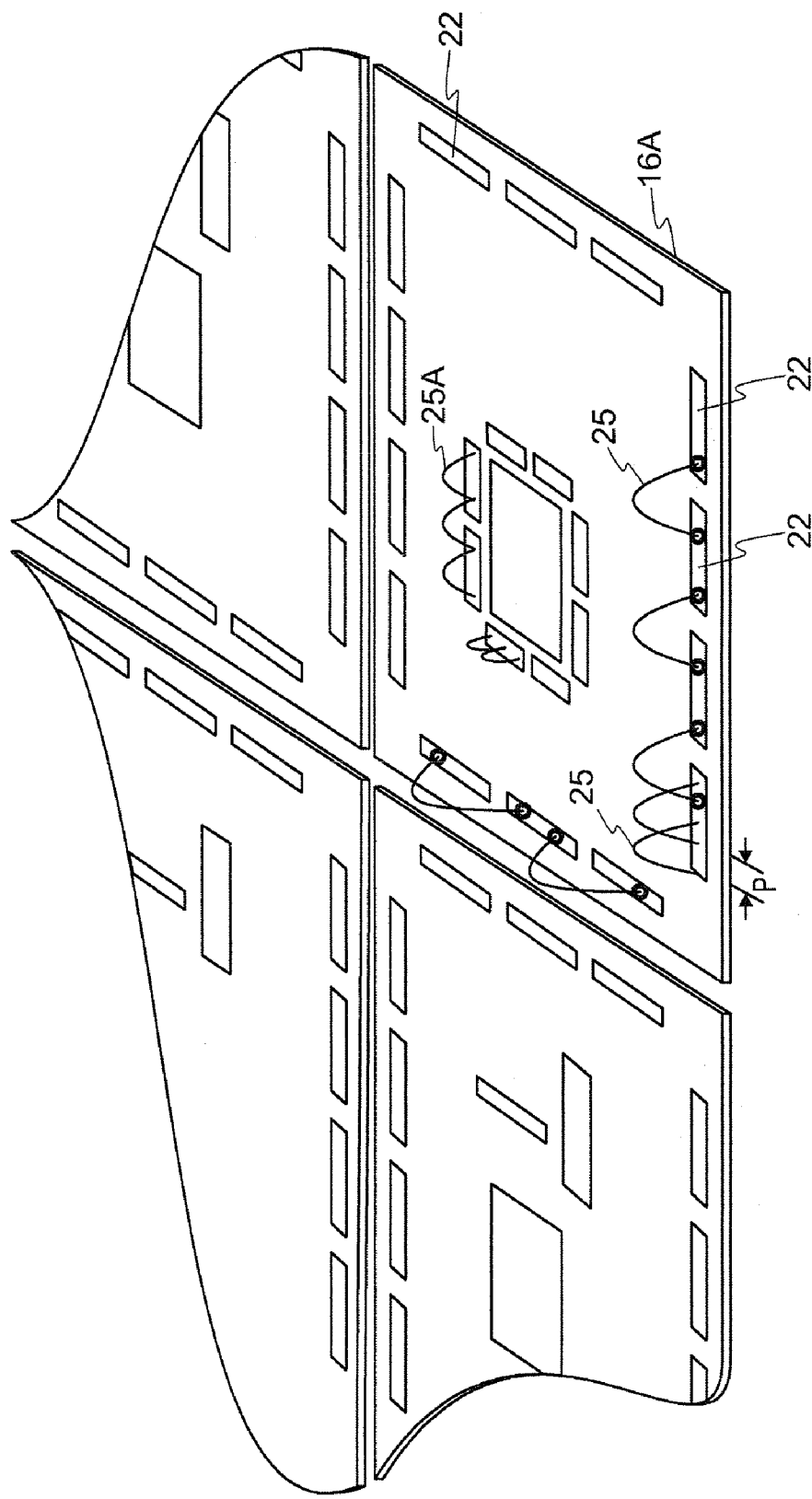
FIG. 5 is an elevated perspective view of another embodiment of the layout of the metal wires on the substrate strip.
Figure 5A:
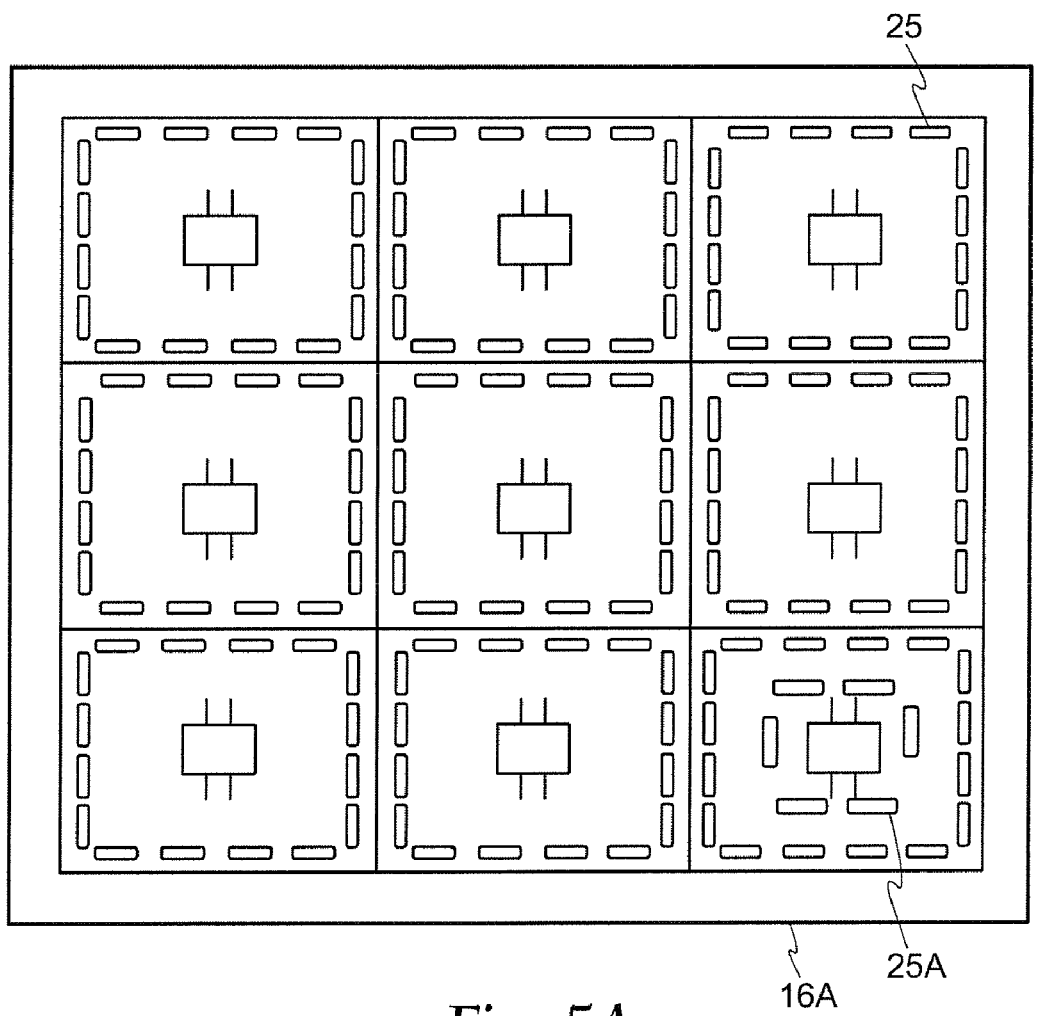
FIG. 5A is a top view of one embodiment of the layout of the metal wires on the substrate strip.

Referring to FIGS. 5 and 5A, another embodiment of the layout of the metal wires 25 on the substrate strip 16A is shown. In this embodiment, the metal wires 25 are looped on the same semiconductor device 10. Thus, the metal wires 25 are electrically coupled to metal traces 22 on the same semiconductor devices 10. In accordance with one embodiment of the present invention, the metal wires 25 are looped and electrically coupled to the metal traces 22 on the same semiconductor device 10 so that the metal wires 25 run approximately parallel to the edges of the semiconductor device 10. The metal wires 25 may be arranged so that the metal wires 25 cross each other within the semiconductor device 10 in order to increase wire density and shield effectiveness. Additional metal wires 25A may be looped and electrically coupled to metal traces 22 internal to the semiconductor device 10 as shown in the bottom right semiconductor device 10 of FIG. 5A. A cleaning process may be performed to remove any mold compound 26 that may have formed on the top of the loop of the metal wires 25. The cleaning step will clean the contact area of the metal wires 25, resulting in increased contact areas and reduced contact resistance between the metal wires 25 and the conductive coating 28. The cleaning step may be done by chemical removal process, a grinding process or other physical abrasion techniques, laser ablation, and the like. The listing of the above is given as examples and should not be seen as to limit the scope of the present invention. A conductive coating 28 is then applied to provide EMI shielding for the semiconductor device 10. The conductive coating 28 is applied so that the conductive coating 28 is in contact with the exposed portion of the top of the loop of the metal wire 25. Thus, the semiconductor device 10 will have a conductive coating 28 that contacts grounded metal.

Figure 6:
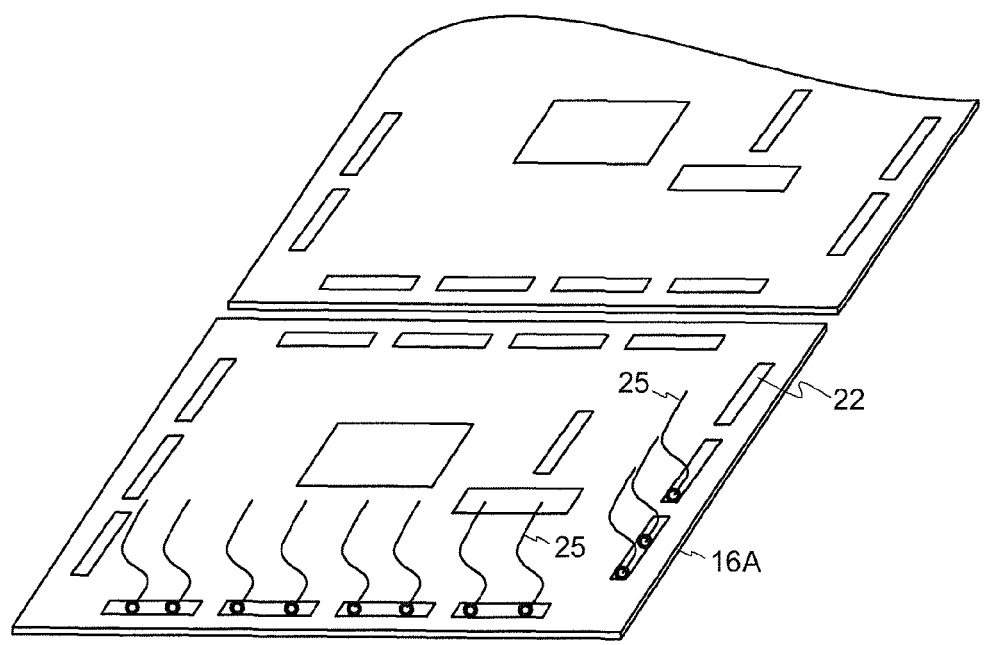
FIG. 6 is an elevated perspective view of another embodiment of the layout of the metal wires on the substrate strip.

Referring to FIG. 6, an elevated perspective view of another embodiment of the layout of the metal wires 25 on the substrate strip 16A is shown. In this embodiment, one end of the metal wire 25 is electrically coupled to the metal trace 22 of the semiconductor device 10. A second end of the metal wire 25 will extend upward so that the second end of the metal wire 25 is exposed and not covered by the mold compound 26. As shown in FIG. 6, the metal wire 25 may be formed to have one or more bends. The bends will allow the metal wire 25 to have a spring like structure. A conductive coating 28 is then applied to provide EMI shielding for the semiconductor device 10. The conductive coating 28 is applied so that the conductive coating is in contact with the exposed portion of the top of the second end of the metal wire 25. Thus, the semiconductor device 10 will have a conductive coating 28 that contacts grounded metal.

Figure 7:
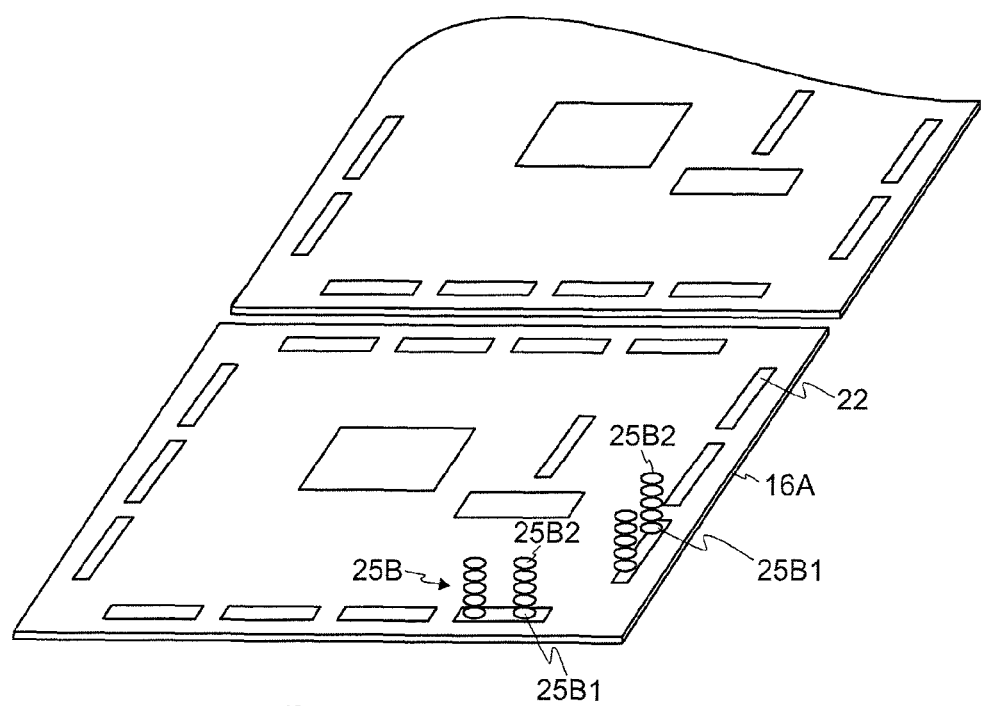
FIG. 7 is an elevated perspective view of another embodiment of the layout of the metal wires on the substrate strip.

Referring to FIG. 7, an elevated perspective view of another embodiment of the layout of the metal wires 25 on the substrate strip 16A is shown. In this embodiment, the metal wire 25 is replaced with a plurality of ball bonds 25B stacked on top of one another. A bottom ball bond 25B1 is electrically coupled to the metal trace 22 of the semiconductor device 10. A top surface of a top ball bond 25B2 will be exposed and will not be covered by the mold compound. A conductive coating 28 is then applied to provide EMI shielding for the semiconductor device 10. The conductive coating 28 is applied so that the conductive coating 28 is in contact with the exposed portion of the top of the ball bond 25B2. Thus, the semiconductor device 10 will have a conductive coating 28 that contacts grounded metal.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
    a substrate having a plurality of metal layers;
    a die coupled to a first surface of the substrate;
    a plurality of metal shielding wires, wherein both ends of each of the metal shielding wires are directly attached to at least one metal layer formed on the first surface of the substrate to form a loop, a first set of the metal shielding wires positioned around an outer perimeter of the substrate, wherein both ends of at least two of the metal shielding wires are directly attached to one metal layer formed on the first surface of the substrate to form a loop;
    a mold compound having approximately planer top and side surfaces for encapsulating the die, a first surface of the substrate, and the plurality of metal shielding wires wherein a portion of the loop of the first set of metal shielding wires is exposed through the top surface of the mold compound; and
    a conductive coating applied to the top surface of the mold compound and to the exposed loop portion of the first set of metal shielding wires.

2. A semiconductor device in accordance with claim 1 wherein a second set of the metal shielding wires having both ends coupled to at least one metal layer to form a loop is positioned around a perimeter of the die, a portion of the loop of each of the second set of the metal shielding wires exposed and coupled to the conductive coating.

3. A semiconductor device in accordance with claim 1 wherein the loops of the first set of metal shielding wires runs approximately parallel to outer edges of the semiconductor device.

4. A semiconductor device in accordance with claim 2 wherein each loop of the first set of metal shielding wires overlaps at least one adjacent loop of the first set of metal shielding wires so that at least one end of a metal shielding wire of the first set is positioned between both ends of an adjacent a metal shielding wire of the first set, wherein each loop of the first set of metal shielding wires is approximately a same height.

5. A semiconductor device in accordance with claim 1 wherein the conductive coating is a conformal coating.

6. A semiconductor device comprising:
    a substrate having a plurality of metal layers;
    a die coupled to a first surface of the substrate;
    a mold compound having a top surface and side surfaces approximately perpendicular to the top surface for encapsulating the die and a first surface of the substrate;
    means for minimizing Electro-Magnetic Interference (EMI) radiation coupled to the top surface of the mold compound; and
    means for coupling the means for minimizing EMI radiation to at least one of the plurality of metal layers formed on the first surface of the substrate positioned around an outer perimeter of the substrate, wherein the means for coupling has both ends of at least two of metal shielding wires directly attached to one metal layer formed on the first surface of the substrate to form loops and a top section of each loop attached to the means for minimizing EMI radiation.

7. A semiconductor device in accordance with claim 6 wherein the means for coupling are a plurality of metal shielding wires, wherein a first end and a second end of each of the metal shielding wires is directly attached to at least one metal layer formed on the first surface of the substrate to form a loop and a top section of the loop is coupled to the means for minimizing EMI radiation.

8. A semiconductor device comprising:
  a substrate;
  a die electrically coupled to a first surface of the substrate;
  a plurality of conductive devices electrically attached to at least one metal trace on the first surface of the substrate, and positioned around an outer perimeter of the substrate;
  a mold compound having a top surface and side surfaces for encapsulating the semiconductor device, wherein a portion of the at least one conductive device extends through the top surface of the mold compound; and
  a conductive coating applied to the top surface of the mold compound and to the exposed portion of the at least one conductive device;
  wherein at least two of the conductive devices have both a first end and a second end directly attached to one metal layer formed on the first surface of the substrate to form loops and a top section of the loops are attached to the conductive coating.

9. A semiconductor device in accordance with claim 8 wherein the at least one conductive device is a metal shielding wire.

10. A semiconductor device in accordance with claim 9 wherein both ends of the metal shielding wire are directly attached to at least one metal trace to form a loop, a portion of the loop exposed and coupled to the conductive coating.

11. A semiconductor device in accordance with claim 10 wherein the loop of the metal shielding wire runs approximately parallel to outer edges of the semiconductor device.

* * * * *